(12) United States Patent
Muraoka

(10) Patent No.: US 6,181,609 B1
(45) Date of Patent: Jan. 30, 2001

(54) SEMICONDUCTOR MEMORY DEVICE HAVING CIRCUIT FOR CONTROLLING DATA-OUTPUT TIMING

(75) Inventor: Yuji Muraoka, Kawasaki (JP)

(73) Assignee: NEC Corporation (JP)

( * ) Notice: Under 35 U.S.C. 154(b), the term of this patent shall be extended for 0 days.

(21) Appl. No.: 09/396,015

(22) Filed: Sep. 15, 1999

(30) Foreign Application Priority Data

Sep. 17, 1998 (JP) .................................................. 10-263569

(51) Int. Cl.⁷ .................................................. G11C 16/04
(52) U.S. Cl. ...................................... 365/189.05; 365/194
(58) Field of Search .............................. 365/189.05, 194, 365/230.06, 230.08

(56) References Cited

U.S. PATENT DOCUMENTS

| 4,897,819 | * | 1/1990 | Takizawa | 365/230.06 |
| 5,737,276 | * | 4/1998 | Shin et al. | 365/230.08 |
| 5,867,447 | * | 2/1999 | Koshikawa | 365/233 |

FOREIGN PATENT DOCUMENTS

| 6-168587 | 6/1994 | (JP) | G11C/11/401 |
| 7-176189 | 7/1995 | (JP) | G11C/11/409 |
| 7-192470 | 7/1995 | (JP) | G11C/11/441 |
| 7-201175 | 8/1995 | (JP) | G11C/11/407 |
| 8-102189 | 4/1996 | (JP) | G11C/11/407 |
| 8-297976 | 11/1996 | (JP) | G11C/11/409 |
| 9-223396 | 8/1997 | (JP) | G11C/11/413 |
| 9-251774 | 9/1997 | (JP) | G11C/11/401 |
| 10-064266 | 3/1998 | (JP) | G11C/11/409 |

* cited by examiner

*Primary Examiner*—Richard Elms
*Assistant Examiner*—Anh Phung
(74) *Attorney, Agent, or Firm*—Hayes, Soloway, Hennessey, Grossman & Hage, P.C.

(57) ABSTRACT

A semiconductor memory device having a latch signal generating circuit which can latch the read data at a data-read timing corresponding to either of the minimum tCAS and the minimum tCP, that is, in either of the low-potential state and the high-potential state of CASB. The semiconductor memory device has different data-read operation cycles, and comprises a decoder into which an address signal is input; a memory cell array consisting of memory cells; a D-latch circuit for latching data output from one of the memory cells which is selected by the decoder; an output buffer for outputting the data which is output from the D-latch circuit; and a latch signal generating circuit for generating a clock signal used in the D-latch circuit, the generated signal having a data-latch timing which is effective in each data-read operation cycle.

3 Claims, 6 Drawing Sheets

SEMICONDUCTOR MEMORY DEVICE HAVING CIRCUIT FOR CONTROLLING DATA-OUTPUT TIMING

BACKGROUND OF THE INVENTION

1. Field of the Invention

The present invention relates to a semiconductor memory device, in particular, one including a circuit which internally detects the current data-output mode and controls the data output timing.

This application is based on Patent Application No. Hei 10-263569 filed in Japan, the contents of which are incorporated herein by reference.

2. Description of the Related Art

Recently, the speed of semiconductor memory devices has been increasing more and more. In a general conventional technique called the high-speed page mode, a clocking operation of a negative logic CAS (column-address strobe) signal, abbreviated as "CASB" hereinbelow, is performed so as to read data transmitted in the same word line. In the high-speed page mode, data is output to an external output pin at the falling (or decaying) timing of the CASB signal, while output data is reset and the external output pin is set to a high-impedance state (i.e., "HI-Z") at the rising timing of the CASB signal. However, as the resetting operation of the output data (when the CASB signal rises) requires a considerable time, the high-potential state of the CASB signal must be maintained for a long time so as to increase the speed of the high-speed page mode. Therefore, it is difficult to further increase the speed.

In order to solve the above problem, EDORAM (Extended Data-Out RAM) has been developed. In the page-mode cycle of EDORAM, no data-resetting operation is performed at the rising timing of the CASB signal and data is maintained until the CASB signal of the next cycle falls. Therefore, the high-potential period of the CASB signal can be minimized so that very high speed can be achieved. Accordingly, EDORAM is currently the most common type of semiconductor memory device.

Below, the internal operations of EDORAM will be explained with reference to FIG. 4. The address signal Ai is input into decoder 100 so as to select a memory cell in memory cell array 101, and a target data is read out and latched by D-latch circuit 102. The output from D-latch circuit 102 is then output via output buffer 104. Here, in the D-latch circuit 102, the latch operation is controlled using signal DL which is an inversion signal of signal AD output from latch signal generating circuit 1.

Also in this arrangement, when the CASB signal falls, read data is output from the memory cell array 101 as the high-speed page mode. However, in the present case, such a falling CASB signal is delayed via a delay element and functions as signal AD. The AD is inverted into signal DL, which is used for latching the read data. Even when the potential of the CASB signal rises next time, the signal DL in synchronism with the CASB signal continues latching data. In addition, EDORAM has a specific access standard called "CASB pre-charge access time (i.e., TACP) mode" (which is not provided in a device of the high-speed page mode); thus, when the CASB signal rises, a new address must be acquired so as to start the data-read operation. Therefore, the data-latch section 102 should be positioned between the internal read-data output line and the data output buffer 104. When the CASB signal falls next time, the above latch signal is inactivated and the latched state is finished so as to output the next read data.

Here, EDORAM has various output modes such as the tAA (i.e., address access time) mode, the above-explained tACP (i.e., CASB pre-charge access time) mode, and tCAC (i.e., CAS access time) mode.

In the tAA mode, the column address is determined in synchronism with the falling timing of the CASB signal.

In the tCAC mode, the CASB falling is made after the column address is determined and a data-read operation is internally performed and thus the data output is ready. That is, in the data-read operation in this tCAC mode, the falling of the CASB signal is kept waiting for a while.

In the tACP mode, the column address is determined when the potential of the CASB signal rises, so that the access speed at the data-reading is determined.

Hereinbelow, normal and abnormal operations of the conventional EDORAM will be explained with reference to FIGS. 5 and 6.

In each timing chart showing the timing of the data-read operation, the CASB signal, address signal Ai, output signal AD from the latch signal generating circuit, and signal DL which is the inversion of signal AD are included.

FIG. 6 shows waveforms in the normal operation, in a relatively low-speed cycle. In this case, tAA is shorter than tCAS (i.e., the low potential state of CASB). In such a case, it is possible to latch and hold the output data by using the signal DL. However, as the speed becomes much higher and tCAS becomes shorter than tAA as shown in FIG. 5, the signal DL is activated earlier than data output; thus, the output cannot be latched.

Here, both the low-potential state (i.e., the tCAS period) and high-potential state (i.e., the pre-charge period, tCP) of CASB are targets for increasing the speed. If tCAS is 20 ns or more, the operation is normally performed as shown in FIG. 6, but with tCAS less than 20 ns, in the tAA cycle, the tCP state appears before the read data is output, as shown in FIG. 5, so that data cannot be latched. If the latch timing is internally controlled (here, delayed) so as to solve the above situation, the latch signal may not be generated in a shorter tCP cycle.

SUMMARY OF THE INVENTION

In consideration of the above problems, an objective of the present invention is to provide a semiconductor memory device having a latch signal generating circuit which can latch the read data at a data-read timing corresponding to either of the minimum tCAS and the minimum tCP. As operation speeds will further increase, the data latch will become much more difficult in each cycle. The device of the present invention also targets such a future situation.

Therefore, the present invention provides a semiconductor memory device having different data-read operation cycles, comprising:

a decoder into which an address signal is input;

a matrix memory cell array consisting of a plurality of memory cells;

a D-latch circuit for latching data output from one of the memory cells which is selected by the decoder;

an output buffer for outputting the data which is output from the D-latch circuit; and a latch signal generating circuit for generating a clock signal used in the D-latch circuit, the generated signal having a data-latch timing which is effective in each data-read operation cycle.

Typically, the kind of the semiconductor memory device is EDORAM, and the different data-read operation cycles include those appearing in an address access time, tAA, mode and a CASB pre-charge access time, tACP, mode.

Preferably, the latch signal generating circuit comprises means for detecting each necessary data-read timing by detecting the state of an external CASB signal when the address signal is changed, and determining a time suitable for latching the data according to the detected result.

The present invention also provides a similar semiconductor memory device having different data-read operation cycles, comprising: a decoder into which an address signal is input; a memory cell array consisting of a plurality of memory cells; a D-latch circuit for latching data output from one of the memory cells which is selected by the decoder; an output buffer for outputting the data which is output from the D-latch circuit; and a latch signal generating circuit which comprises:

an address transition detecting circuit, including a delay element and an exclusive OR gate, for generating a one-shot signal when the address signal is changed;

two delay elements, having different delay lengths, into which an external CASB signal is input;

an operation mode detecting circuit composed of a D-latch circuit in which the one-shot signal functions as a clock signal and into which the CASB signal is input; and a data selector for choosing one of the outputs from the two delay elements in accordance with the potential of the output from the operation mode detecting circuit, and generating a data-latch signal having a data-latch timing which is effective in each data-read operation cycle.

According to the present invention, the state of the CASB signal is detected when the address is changed or switched, thereby selecting a suitable delay value. Here, selectable delay times are respectively and specifically assigned to the different data-read operation cycles in advance. Therefore, in any operation mode such as tAA, tACP, and tCAC, the read data can be latched and then the latched state is finished without problems.

DESCRIPTION OF THE PREFERRED EMBODIMENTS

Hereinafter, an embodiment of the present invention will be explained with reference to the drawings.

Figure 1:
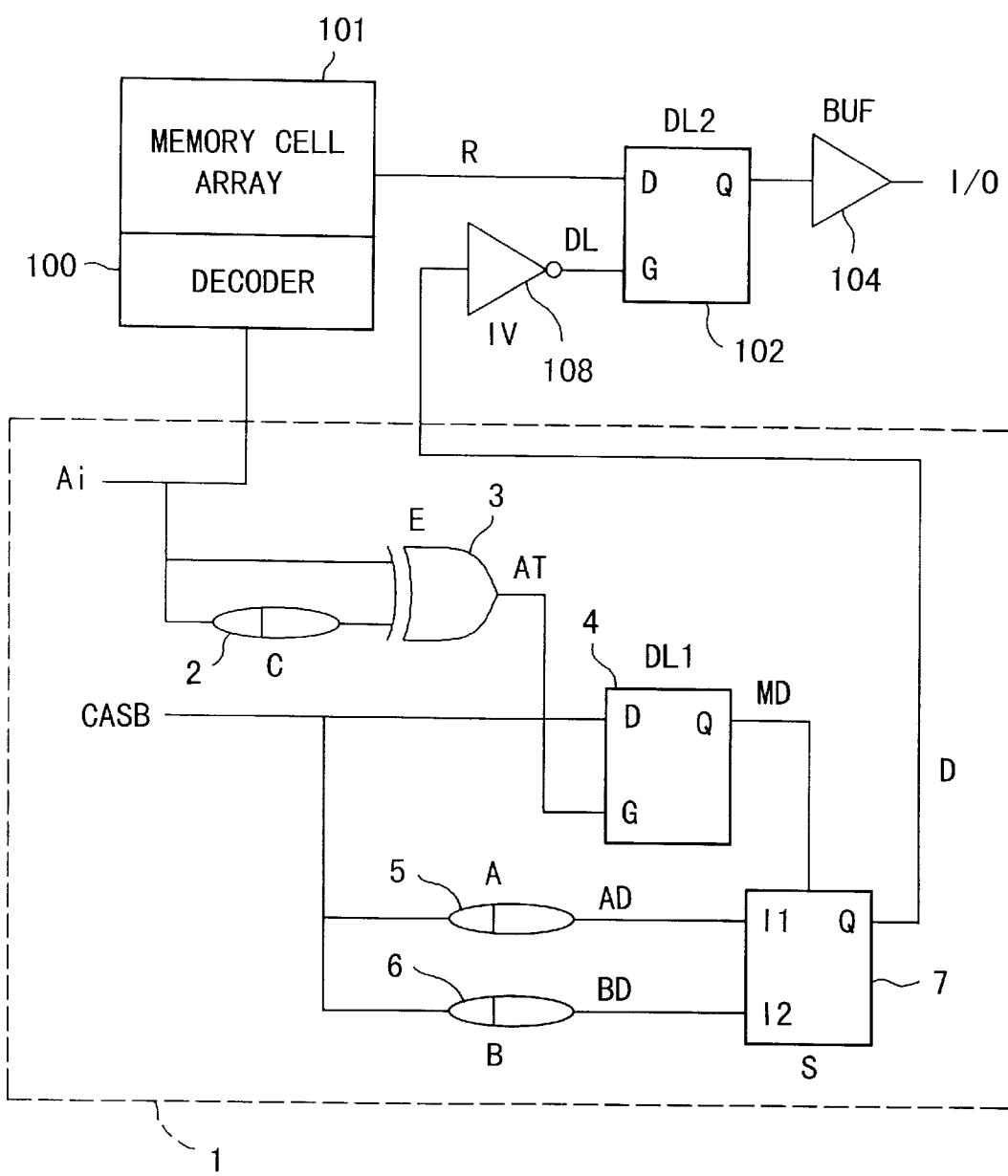
FIG. 1 is a diagram showing the general structure of the semiconductor memory device according to the present invention.
Figure 4:
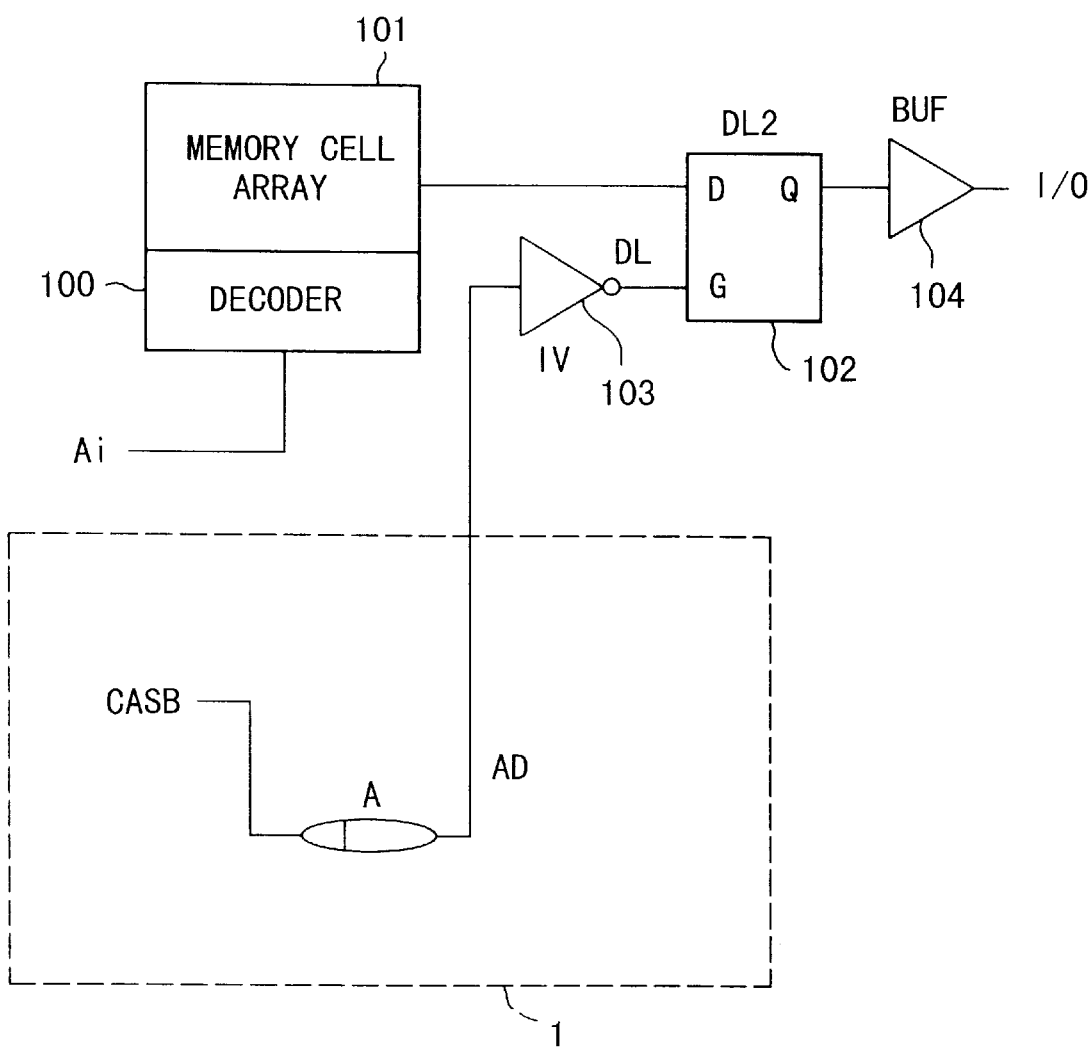
FIG. 4 is a diagram showing the general structure of a conventional semiconductor memory device.
Figure 5:
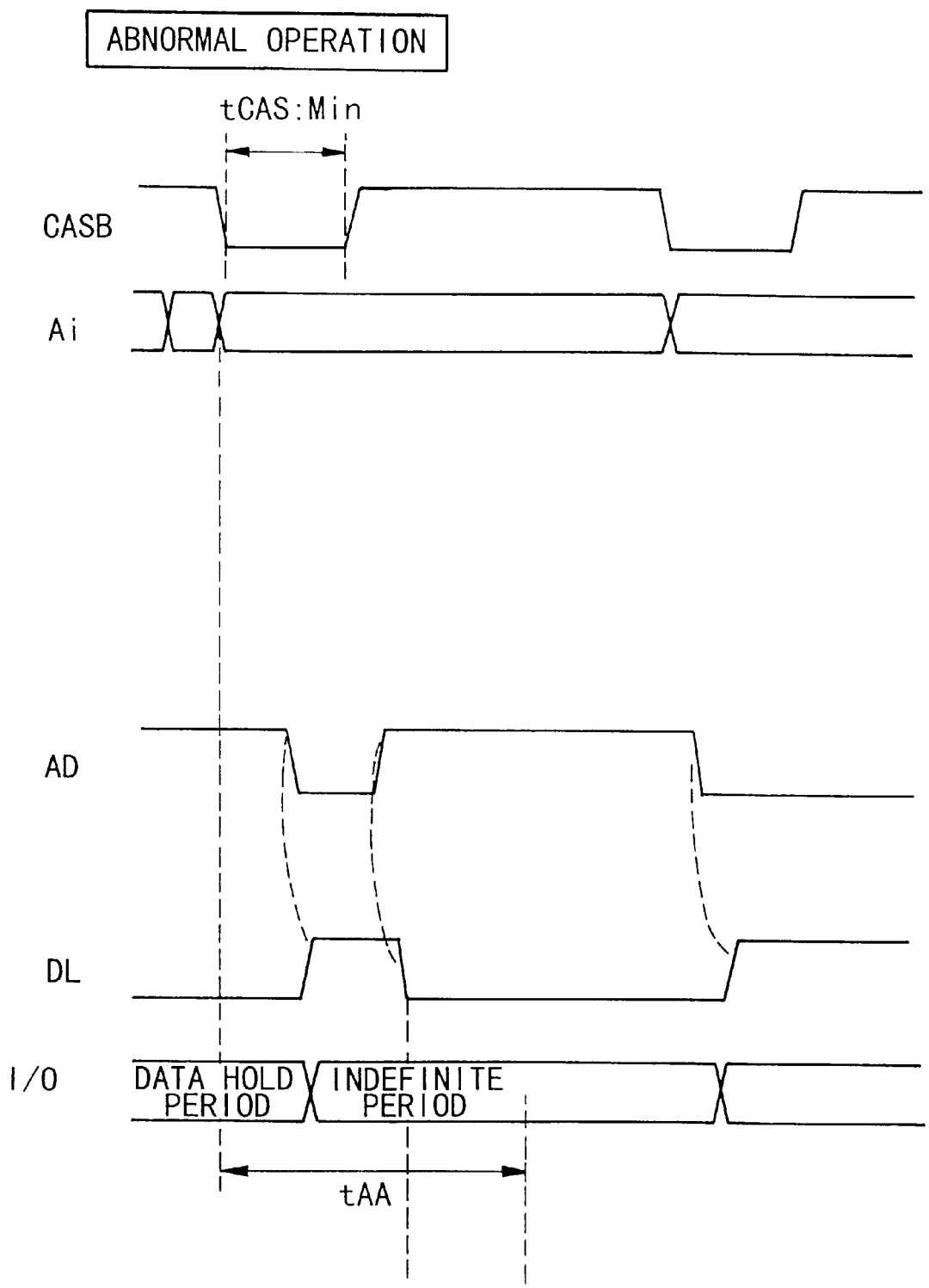
FIG. 5 is a timing chart of an abnormal data-read operation in a conventional semiconductor memory device.
Figure 6:
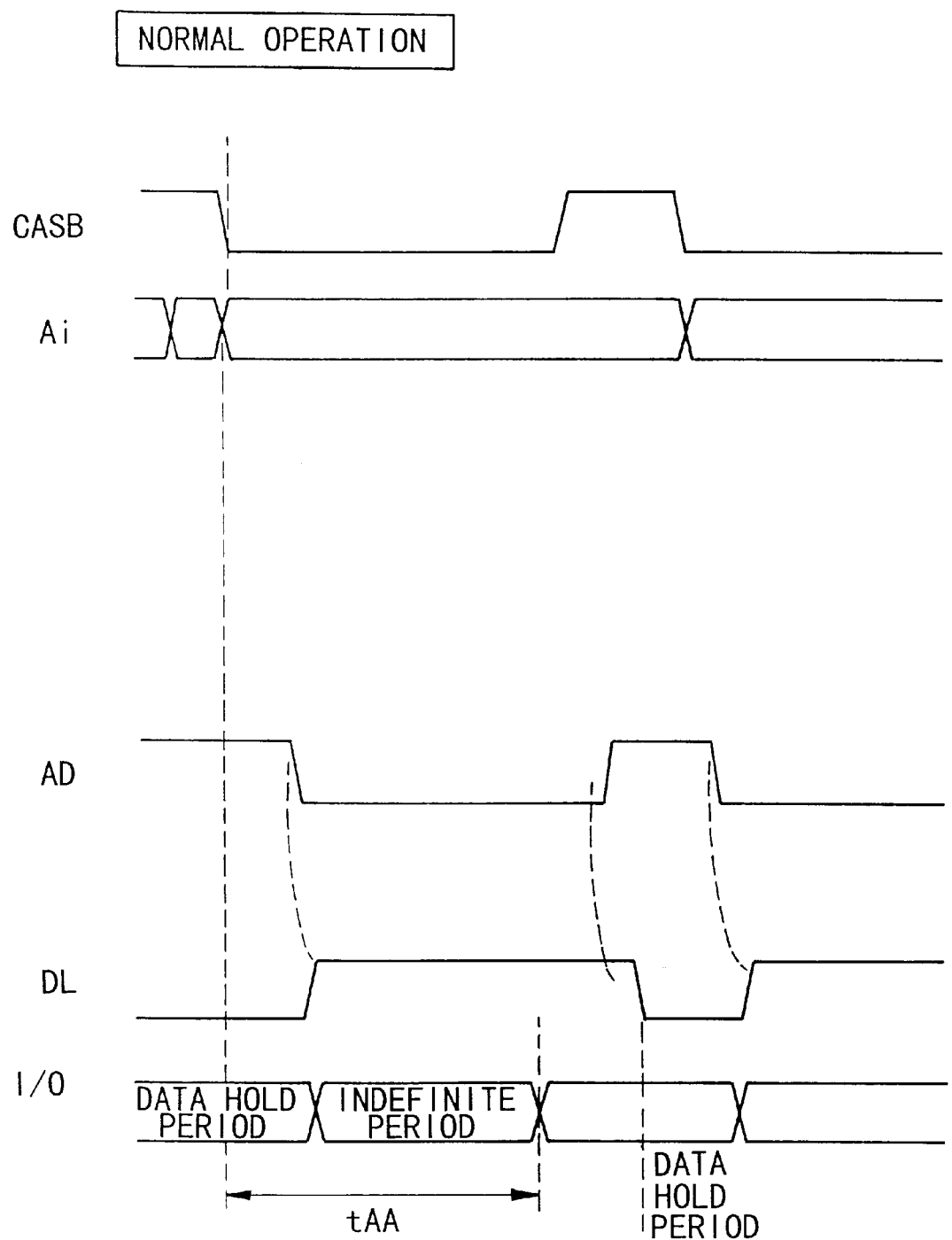
FIG. 6 is a timing chart of a normal data-read operation in a conventional semiconductor memory device.

FIG. 1 is a diagram showing the structure of the semiconductor memory device according to the present invention. This device comprises decoder 100 into which internally generated address signal Ai is input, (matrix) memory cell array 101 consisting of memory cells, D-latch circuit 102 for latching data R output from a cell selected by the decoder, output buffer 104 for outputting the data, and latch signal generating circuit 1 for generating a clock signal used in the D-latch circuit 102. Here, the reference numerals used basically correspond to those used in FIG. 4.

The latch signal generating circuit 1 has the following internal structure and operations: The internal address signal Ai and the signal output from delay element 2 (into which the address signal Ai is input) are input into exclusive OR circuit 3. The signal AT output from the circuit 3 becomes a one-shot signal having a delay-time width when the address signal changes. The D-latch circuit 4 detects the state of the CASB signal while the signal AT is active, and holds the detected state as the signal MD. The CASB signal is input into two delay elements 5 and 6, which have different delay lengths (or times), and output signals AD and BD are respectively obtained from delay elements 5 and 6. The delay value of element 6 is equal to or larger than the difference between tCAS and tAA, while the delay value of element 5 is within tCP. These delay values are determined in each specification.

One of outputs AD and BD is chosen as output signal D by selector circuit 7, which chooses one of the outputs AD and BD based on the state of the above signal MD. The signal D is input into inverter circuit 103, from which output signal DL is obtained. This signal DL is used for internally holding the read data, and thus the read data R is held by the D-latch circuit 102.

Next, the operations of the latch signal generating circuit will be explained with reference to FIGS. 2 and 3.

Figure 2:
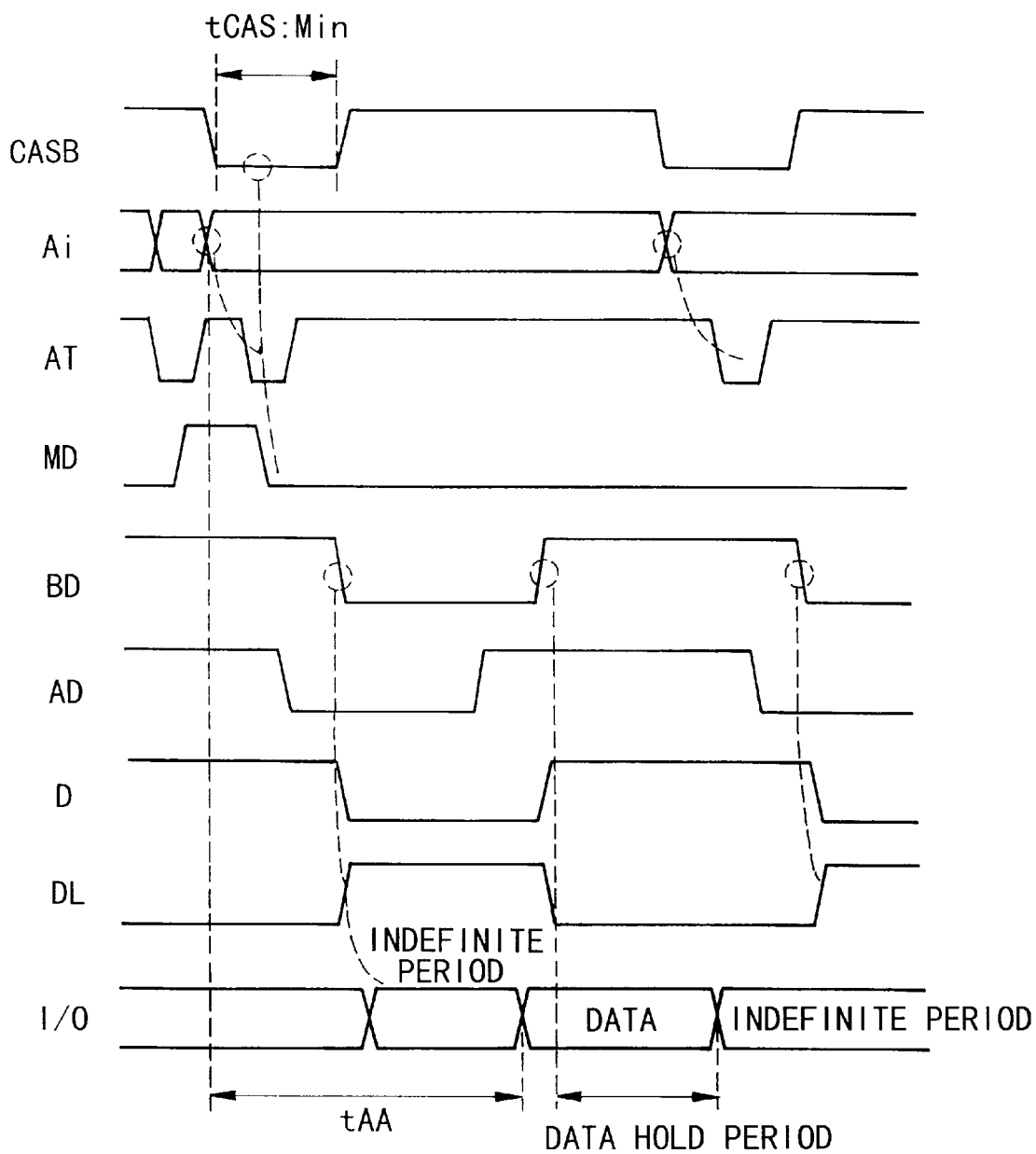
FIG. 2 is a timing chart of the data-read operation in the tAA mode in the semiconductor memory device.
Figure 3:
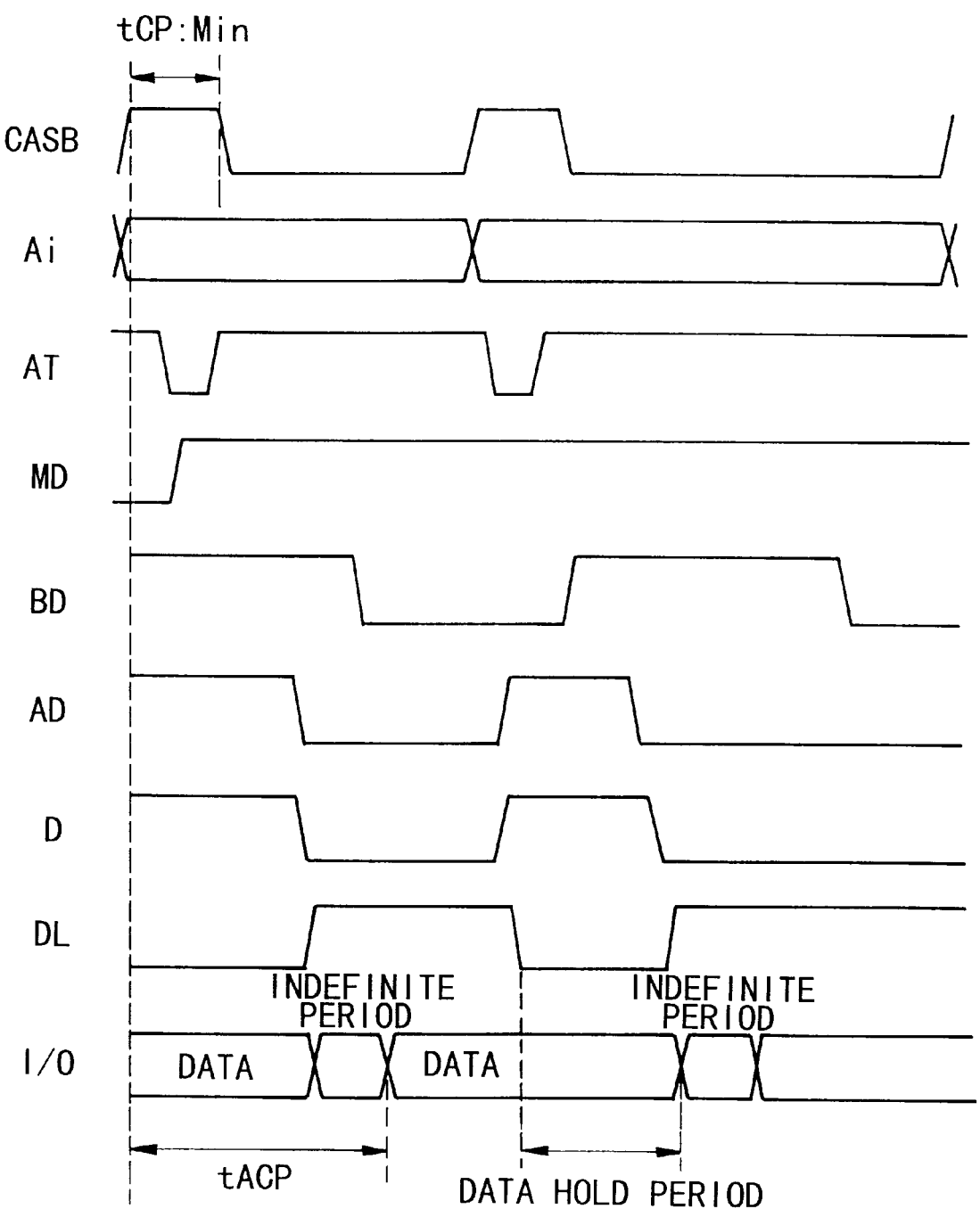
FIG. 3 is a timing chart of the data-read operation in the tACP mode in the semiconductor memory device.

The timing chart of FIG. 2 includes the waveforms of (i) CASB in the tAA cycle at tCAS less than 20 ns, (ii) address Ai, (iii) one-shot output signal AT output from the address transition detecting circuit which includes delay element 2 and exclusive OR gate 3, (iv) signal MD output from the operation mode detecting circuit, that is, D-latch circuit 4, (v) delayed output BD of CASB, (vi) delayed output AD of CASB, (vii) signal D output from the selector circuit for choosing the operation mode, (viii) clock signal DL used in D-latch circuit 102, and (i) data output "I/O".

In FIG. 2, if the address transition is performed at the same timing of CASB falling, when the signal AT is active, the CASB signal has a low potential. Accordingly, the signal MD also has a low potential, and signal BD is transmitted as output D.

With reference to the waveforms shown in FIG. 3, the internal operation in the tACP cycle, performed when tCP has the minimum value, will be explained. In the tACP cycle, the address is changed when the CASB signal rises; thus, when the signal AT becomes active, the CASB signal has a high potential. Accordingly, the signal MD has a high potential and signal AD is transmitted as output D.

What is claimed is:

1. A semiconductor memory device having different data-read operation cycles, comprising:

a decoder into which an address signal is input;

a matrix memory cell array consisting of a plurality of memory cells;

a D-latch circuit for latching data output from one of the memory cells which is selected by the decoder;

an output buffer for outputting the data which is output from the D-latch circuit; and a latch signal generating circuit for generating a clock signal used in the D-latch circuit, the generated signal having a data-latch timing which is effective in each data-read operation cycle; wherein the latch signal generating circuit detecting each necessary data-read timing by detecting the state of an external CASB signal when the address signal is changed, and determining a time suitable for latching the data according to the detected result.

2. A semiconductor memory device as claimed in claim 1, wherein the kind of the semiconductor memory device is EDORAM, and the different data-read operation cycles include those appearing in an address access time, tAA, mode and a CASB pre-charge access time, tACP, mode.

3. A semiconductor memory device having different data-read operation cycles, comprising:

a decoder into which an address signal is input;

a memory cell array consisting of a plurality of memory cells;

a D-latch circuit for latching data output from one of the memory cells which is selected by the decoder;

an output buffer for outputting the data which is output from the D-latch circuit; and a latch signal generating circuit which comprises:

an address transition detecting circuit, including a delay element and an exclusive OR gate, for generating a one-shot signal when the address signal is changed;

two delay elements, having different delay lengths, into which an external CASB signal is input;

an operation mode detecting circuit composed of a D-latch circuit in which the one-shot signal functions as a clock signal and into which the CASB signal is input; and a data selector for choosing one output from the two delay elements in accordance with the potential of the output from the operation mode detecting circuit, and generating a data-latch signal having a data-latch timing which is effective in each data-read operation cycle.

* * * * *